United States Patent
Lee et al.

(10) Patent No.: US 12,347,774 B2
(45) Date of Patent: Jul. 1, 2025

(54) INTEGRATED CIRCUIT DEVICES INCLUDING METAL LINES SPACED APART FROM METAL VIAS, AND RELATED FABRICATION METHODS

(71) Applicant: Samsung Electronics Co., Ltd., Suwon-si (KR)

(72) Inventors: Janggeun Lee, Delmar, NY (US); Jaemyung Choi, Niskayuna, NY (US); Wonhyuk Hong, Clifton Park, NY (US); Kang-ill Seo, Albany, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 489 days.

(21) Appl. No.: 17/820,949

(22) Filed: Aug. 19, 2022

(65) Prior Publication Data

US 2023/0352405 A1 Nov. 2, 2023

Related U.S. Application Data

(60) Provisional application No. 63/335,342, filed on Apr. 27, 2022.

(51) Int. Cl.
*H01L 23/528* (2006.01)
*H01L 21/768* (2006.01)
*H01L 23/522* (2006.01)
*H01L 23/532* (2006.01)

(52) U.S. Cl.
CPC .... *H01L 23/5283* (2013.01); *H01L 21/76819* (2013.01); *H01L 23/5226* (2013.01); *H01L 23/53295* (2013.01); *H01L 23/53228* (2013.01); *H01L 23/53257* (2013.01)

(58) Field of Classification Search
CPC ............ H01L 23/5283; H01L 23/5226; H01L 23/53295; H01L 23/53228; H01L 23/53257; H01L 21/76819
USPC ......................................................... 257/774
See application file for complete search history.

(56) References Cited

U.S. PATENT DOCUMENTS

| | | |
|---|---|---|
| 6,455,436 B1 | 9/2002 | Ueda et al. |
| 7,790,631 B2 | 9/2010 | Sharma et al. |
| 9,570,377 B2 | 2/2017 | Jin et al. |
| 10,847,417 B1 | 11/2020 | Yao et al. |
| 10,879,107 B2 | 12/2020 | Dutta et al. |
| 10,985,312 B2 | 4/2021 | Liao et al. |
| 11,222,843 B2 | 1/2022 | Huang et al. |
| 11,227,833 B2 | 1/2022 | Lee et al. |
| 2017/0125340 A1* | 5/2017 | Tsai ................... H01L 21/02178 |

(Continued)

OTHER PUBLICATIONS

Extended European Search Report corresponding to EP 23169432.4; dated Oct. 12, 2023 (8 pages).

*Primary Examiner* — Tu-Tu V Ho
(74) *Attorney, Agent, or Firm* — Myers Bigel, P.A.

(57) ABSTRACT

Integrated circuit devices are provided. An integrated circuit device includes a first insulating layer and a metal via that is in the first insulating layer. The integrated circuit device includes a second insulating layer on the first insulating layer. The integrated circuit device includes a conductive material that is between sidewalls of the second insulating layer and on the metal via. Moreover, the integrated circuit device includes a metal line that is on the conductive material and/or the second insulating layer. Related methods of forming integrated circuit devices are also provided.

18 Claims, 15 Drawing Sheets

(56) References Cited

U.S. PATENT DOCUMENTS

| | | |
|---|---|---|
| 2020/0135560 A1 | 4/2020 | Clevenger et al. |
| 2021/0082814 A1* | 3/2021 | Lee .................. H01L 21/76883 |
| 2022/0020688 A1 | 1/2022 | Xie et al. |
| 2022/0037202 A1 | 2/2022 | Lin et al. |

* cited by examiner

INTEGRATED CIRCUIT DEVICES INCLUDING METAL LINES SPACED APART FROM METAL VIAS, AND RELATED FABRICATION METHODS

CLAIM OF PRIORITY

The present application claims the benefit of U.S. Provisional Patent Application Ser. No. 63/335,342, filed on Apr. 27, 2022, entitled FULLY SELF ALIGNED VIA PATTERNING AT BEOL PROCESS, the disclosure of which is hereby incorporated herein in its entirety by reference.

FIELD

The present disclosure generally relates to the field of integrated circuit devices and, more particularly, to metal lines in integrated circuit devices.

BACKGROUND

As integrated circuit devices continue to increase in density and performance, it may be difficult to scale metal vias and metal lines of integrated circuit devices. For example, scaled-down metal vias and metal lines may be undesirably close to each other and/or may be more difficult to form. As an example, a scaled-down metal via and a scaled-down metal line may inadvertently contact each other, or be close enough to cause shorting.

SUMMARY

An integrated circuit device, according to some embodiments herein, may include a first insulating layer and a metal via that is in the first insulating layer. The integrated circuit device may include a second insulating layer on the first insulating layer. The integrated circuit device may include a conductive material that is between sidewalls of the second insulating layer and on the metal via. The integrated circuit device may include a third insulating layer on the second insulating layer. The integrated circuit device may include a metal line that is in the third insulating layer, on the conductive material, and electrically connected to the metal via through the conductive material. Moreover, a portion of the third insulating layer may contact a portion of an upper surface of the metal via.

An integrated circuit device, according to some embodiments herein, may include a first insulating layer and a metal via that is in the first insulating layer. The integrated circuit device may include a second insulating layer on the first insulating layer. The integrated circuit device may include a conductive material that is in the second insulating layer and on the metal via. The integrated circuit device may include a metal line on a continuous portion of the second insulating layer. Moreover, the continuous portion of the second insulating layer may be wider than the metal line.

A method of forming an integrated circuit device, according to some embodiments herein, may include forming a conductive material on a metal via and not on a first insulating layer that the metal via is in. The method may include forming a second insulating layer on the first insulating layer, after forming the conductive material. The method may include forming a first metal line on the second insulating layer and a second metal line on the conductive material. The first metal line may be electrically isolated from the metal via. Moreover, the second metal line may be electrically connected to the metal via through the conductive material.

DETAILED DESCRIPTION

Pursuant to embodiments herein, integrated circuit devices are provided that include metal lines that are spaced apart from metal vias. For example, embodiments herein can provide an insulating layer under a first metal line to increase the distance by which the first metal line is spaced apart from a diagonally-adjacent metal via. Moreover, a second metal line may be electrically connected to the metal via through a conductive material that is on the metal via and spaced apart from the first metal line. The conductive material may be formed on the metal via. As an example, the conductive material may be formed by selective deposition on the metal via. The metal via may be part of a BEOL region of an integrated circuit device.

By increasing the distance between the metal via and the first metal line that is adjacent (e.g., diagonally above) the metal via, the risk of an electrical short between the metal via and the first metal line may be reduced. Moreover, because the increased distance is due to the presence of the insulating layer (which may be very close to the metal via) rather than due to a narrowing of the metal via, the metal via may be relatively wide and thus relatively easy to form. As an example, it may be easier to form a wide opening in an insulating layer (e.g., by a reactive ion etching ("RIE") process) than a narrow opening, and it may be easier to form the metal via by a metallization process in the wide opening than in the narrow opening. In contrast, the high aspect ratio of the narrow opening can make ME and metal-fill processes difficult.

Example embodiments will be described in greater detail with reference to the attached figures.

Figure 1:
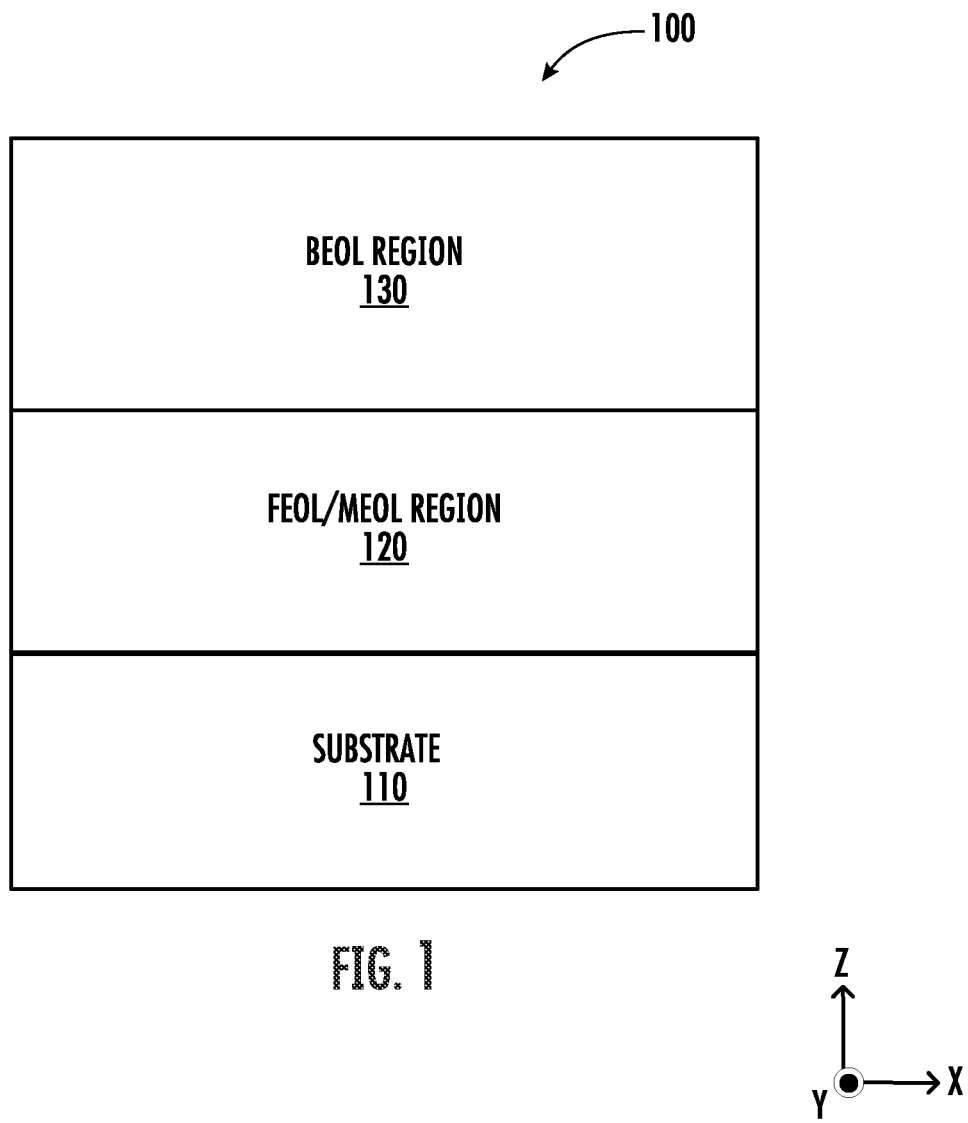
FIG. 1 is a schematic block diagram of an integrated circuit device according to some embodiments herein.

FIG. 1 is a schematic block diagram of an integrated circuit device 100 according to some embodiments. The device 100 may be, for example, a semiconductor memory device for storing data and/or a semiconductor logic device for processing data. The device 100 includes a substrate 110, a BEOL region 130 that is on the substrate 110, and a front-end-of-line ("FEOL") and/or middle-end-of-line ("MEOL") region 120 that is between (in a vertical direction Z) the BEOL region 130 and the substrate 110. As an example, the FEOL/MEOL region 120 may include devices such as transistors, capacitors, and/or resistors. Moreover, the BEOL region 130 may include interconnect wires, vias, and dielectric structures.

Figure 2A:
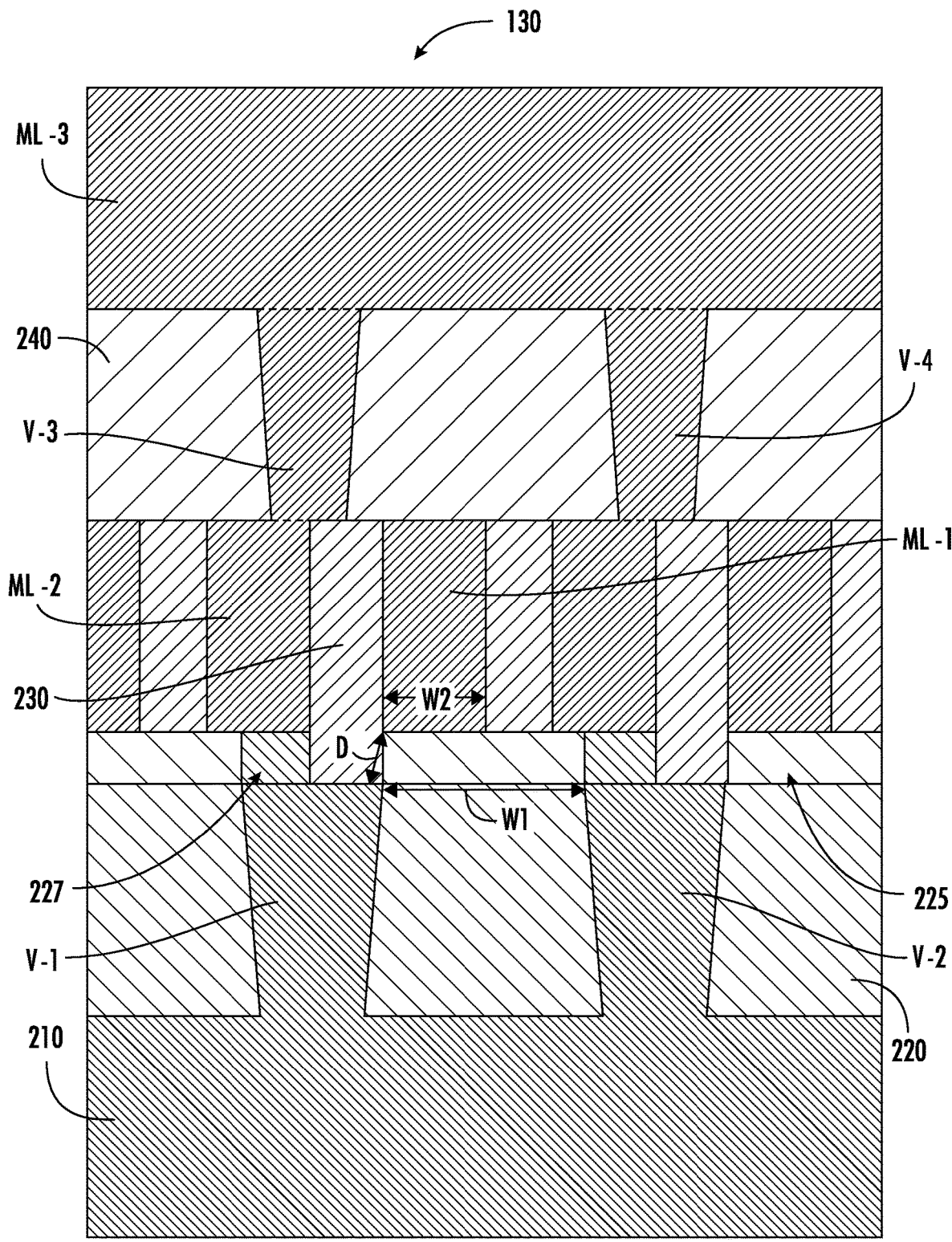
FIGS. 2A and 2B are example cross-sectional views of the back-end-of-line ("BEOL") region of the integrated circuit device of FIG. 1.
Figure 2B:
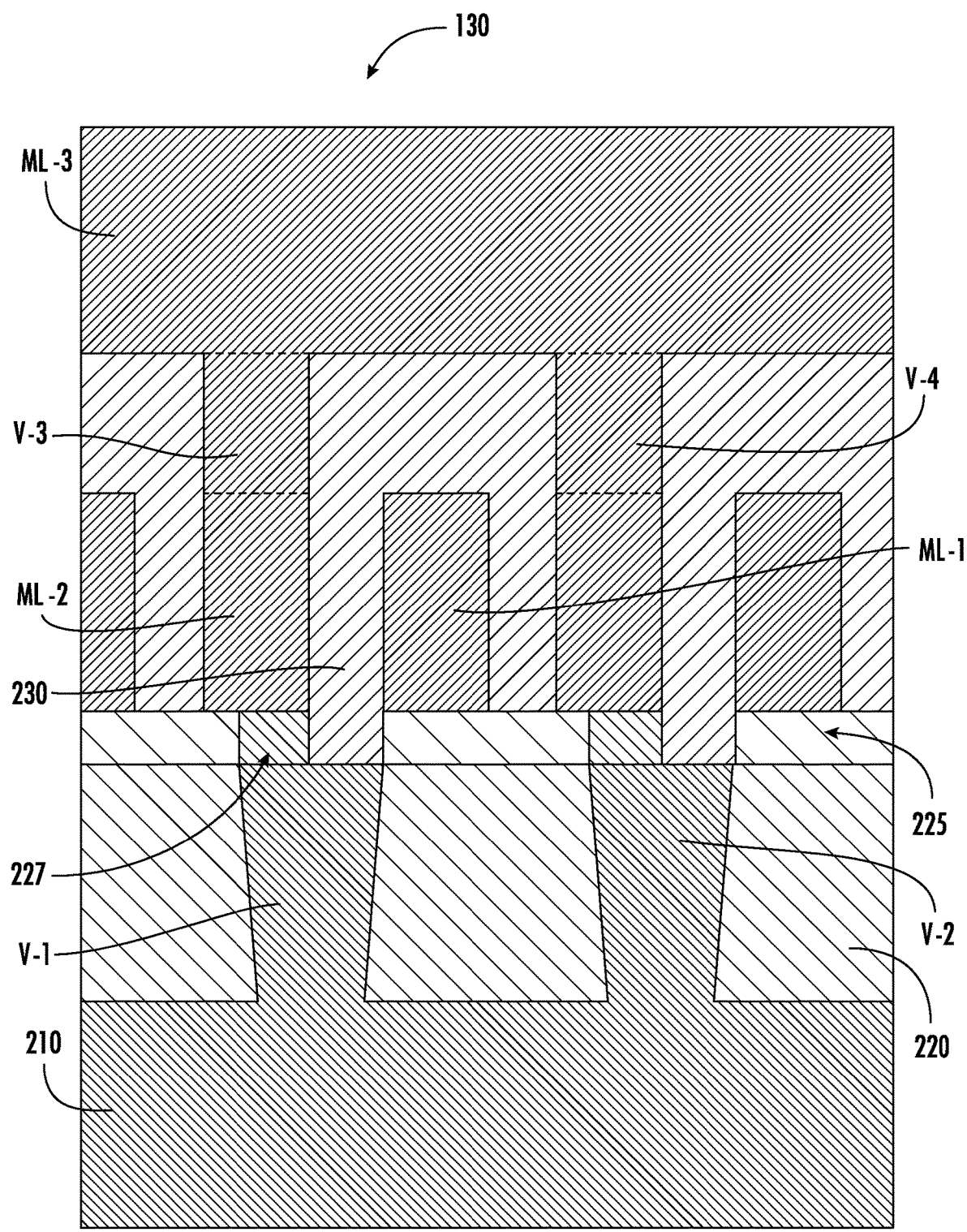

FIGS. 2A and 2B are example cross-sectional views of the BEOL region 130 of the example integrated circuit device 100 of FIG. 1. In some embodiments, the structures shown in FIGS. 2A and 2B may be formed by a damascene process and a top-via process, respectively.

As shown in FIG. 2A, the BEOL region 130 comprises a plurality of BEOL elements, including various metal lines (e.g., metal wires) ML and metal vias V. For example, first and second metal vias V-1, V-2 may be in a first insulating layer 220, and a conductive material 227 may be on/between sidewalls of (e.g., may be in) a second insulating layer 225 that is on the first insulating layer 220. First and second metal lines ML-1, ML-2 may be in a third insulating layer 230 that is on the second insulating layer 225. Moreover, in the example of FIG. 2A, third and fourth metal vias V-3, V-4 may be in a fourth insulating layer 240 that is on the third insulating layer 230, and a third metal line ML-3 may extend across the third and fourth metal vias V-3, V-4.

The first and second metal vias V-1, V-2 may each protrude upward from a metal base 210 in the vertical direction Z away from the substrate 110 (FIG. 1) of the device 100. In some embodiments, the first and second metal vias V-1, V-2 include the same metal as the base 210. For example, the base 210 and the first and second metal vias V-1, V-2 may each include tungsten or copper.

The first metal via V-1 is spaced apart from the second metal via V-2 in the first insulating layer 220. For example, the first metal via V-1 may be separated from the second metal via V-2 in a horizontal direction X by the first insulating layer 220.

As shown in FIG. 2A, the first insulating layer 220 may be on an upper surface of the base 210, and on sidewalls of the first and second metal vias V-1, V-2. Accordingly, the first and second metal vias V-1, V-2 may be in the first insulating layer 220. As an example, the first insulating layer 220 may contact sidewalls of the first and second metal vias V-1, V-2. In some embodiments, an upper surface of the first insulating layer 220 may be coplanar with upper surfaces of the first and second metal vias V-1, V-2. The first insulating layer 220 may comprise, for example, silicon oxide, silicon oxynitride, silicon nitride, or a low-k dielectric material.

As used herein, the term "low-k" refers to a material that has a smaller dielectric constant than silicon dioxide. The low-k material may include, for example, fluorine-doped silicon dioxide, organosilicate glass, carbon-doped oxide, porous silicon dioxide, porous organosilicate glass, a spin-on organic polymeric dielectric, or a spin-on silicon based polymeric dielectric.

The second insulating layer 225 may include a different insulating material from that of the first insulating layer 220. For example, the second insulating layer 225 may include nitrogen (e.g., silicon and nitrogen, such as silicon oxynitride or silicon nitride), and the first insulating layer 220 may not include nitrogen (e.g., may comprise oxygen but not nitrogen), or vice versa. Moreover, the second insulating layer 225 may include a different insulating material from that of the third insulating layer 230. As an example, the second insulating layer 225 may include nitrogen, and the third insulating layer 230 may not include nitrogen (e.g., but rather may comprise, for example, silicon oxide or a low-k dielectric material), or vice versa. In some embodiments, a portion of an upper surface of the second insulating layer 225 may contact a lower surface of the third insulating layer 230, and a lower surface of the second insulating layer 225 may be on (e.g., may contact) an upper surface of the first insulating layer 220.

The first and second metal lines ML-1, ML-2 are adjacent and spaced apart from the first metal via V-1. As shown in FIG. 2A, the first metal line ML-1 may be spaced apart from the first metal via V-1 by a distance D (e.g., diagonal distance). The distance D may increase with increasing thickness of the second insulating layer 225. The thickness, in the direction Z, of the second insulating layer 225 may be 5-20 nanometers ("nm") and may be thinner than each of respective thicknesses, in the direction Z, of the first insulating layer 220, the third insulating layer 230, and the first metal line ML-1. As an example, the thickness may be about 10 nm. The second insulating layer 225 can reduce the risk of an electrical short between the first metal line ML-1 and the first metal via V-1.

A lower surface of the first metal line ML-1 may be on (e.g., may contact) an upper surface of a continuous portion (i.e., a single, undivided portion), in the direction X, of the second insulating layer 225. The continuous portion of the second insulating layer 225 may be wider than the first metal line ML-1. For example, a width W1, in the direction X, of the upper surface of the continuous portion of the second insulating layer 225 may be wider than a width W2, in the direction X, of the lower surface of the first metal line ML-1.

The second metal line ML-2 is electrically connected to the first metal via V-1 through the conductive material 227. In some embodiments, the conductive material 227 may comprise a different conductive material (e.g., a different metal) from that of the second metal line ML-2 and/or that of the first metal via V-1. As an example, the first metal via V-1, the conductive material 227, and the second metal line ML-2 may comprise different first, second, and third conductive materials, respectively. According to some embodiments, the conductive material 227 may not include tungsten or copper and/or may not include ruthenium or molybdenum. Rather, the conductive material 227 may comprise, for example, cobalt, tungsten, titanium, and/or tantalum.

The conductive material 227 is between, in the direction Z, the second metal line ML-2 and the first metal via V-1. For example, an upper surface of the conductive material 227 may contact a lower surface of the second metal line ML-2, and a lower surface of the conductive material 227 may be on (e.g., may contact) an upper surface of the first metal via V-1. According to some embodiments, the lower surface of the conductive material 227 is coplanar with the lower surface of the second insulating material 225, and/or the upper surface of the conductive material 227 is coplanar with the upper surface of the second insulating material 225. For example, the conductive material 227 may have a thickness, in the direction Z, equal to that of the second insulating material 225.

In some embodiments, a sidewall of the conductive material 227 may be spaced apart, in the direction X, from a sidewall of the second insulating layer 225. As an example, the lower surface of the conductive material 227 may be on a first portion of the upper surface of the first metal via V-1, and a lower surface of the third insulating layer 230 may be on a second portion of the upper surface of the first metal via V-1, in a horizontal (X direction) space between the sidewall of the conductive material 227 and the sidewall of the second insulating layer 225. For example, the third insulating layer 230 may include a first portion that is on (e.g., that contacts) a portion of the upper surface of the second insulating layer 225 and a second portion that is on (e.g., that contacts) the second portion of the upper surface of the first metal via V-1.

A lower part of the second portion of the third insulating layer 230 may be between (e.g., in contact with) the respective sidewalls of the conductive material 227 and the second insulating layer 225. Accordingly, the third insulating layer 230 may electrically isolate the first metal line ML-1 from the first metal via V-1 and from the conductive material 227. Moreover, the first and second metal lines ML-1, ML-2 are spaced apart from each other by an upper part of the second portion of the third insulating layer 230.

Due to the space between the conductive material 227 and the second insulating layer 225, the conductive material 227 may be narrower, in the direction X, than the upper surface of the first metal via V-1. Moreover, the conductive material 227 may be narrower, in the direction X, than the second metal line ML-2.

In some embodiments, the second metal line ML-2 may be shifted (e.g., due to misalignment during a fabrication process), in the direction X, relative to the first metal via V-1. The second metal line ML-2 may thus not be centered, in the direction X, relative to the first metal via V-1, as shown in FIG. 2A/2B. Likewise, the conductive material 227 may not be centered, in the direction X, relative to the first metal via V-1. In other embodiments, however, the second metal line ML-2 and the conductive material 227 may be centered, in the direction X, relative to the first metal via V-1, as shown in FIG. 3J.

FIG. 2A shows that the first metal line ML-1 may be shifted along with the second metal line ML-2. Such a shift may thus bring the first metal line ML-1 closer, in the direction X, to the first metal via V-1. Despite this proximity in the direction X, the second insulating layer 225 can separate the first metal via V-1 from the first metal line ML-1 by the distance D and thereby inhibit an electrical short.

The sidewall of the conductive material 227 that is spaced apart from the sidewall of the second insulating layer 225 by the third insulating layer 230 may be aligned, in the direction Z, with a sidewall of the second metal line ML-2. As a result, the conductive material 227 may be no closer than the second metal line ML-2 to the first metal line ML-1, and thus is unlikely to be electrically shorted to the first metal line ML-1.

The fourth insulating layer 240 is on (e.g., may contact) an upper surface of the third insulating layer 230. According to some embodiments, the fourth insulating layer 240 may comprise the same insulating material as the third insulating layer 230. In other embodiments, the fourth insulating layer 240 may comprise a different insulating material from that of the third insulating layer 230.

The third and fourth metal vias V-3, V-4 are in the fourth insulating layer 240. The third metal via V-3 is on and electrically connected to the second metal line ML-2. The third metal via V-3 is electrically connected to the first metal via V-1 through the second metal line ML-2 and the conductive material 227. The fourth metal via V-4 is on and electrically connected to another metal line that is in the third insulating layer 230. The fourth metal via V-4 is electrically connected to the second metal via V-2 through the other metal line and a conductive material (e.g., the same material as the conductive material 227) that is on the other metal line.

The third metal line ML-3 is on (e.g., may contact) an upper surface of the fourth insulating layer 240, and extends continuously in the direction X across upper surfaces of the third and fourth metal vias V-3, V-4, respectively. For example, the third metal line ML-3 may contact the respective upper surfaces of the third and fourth metal vias V-3, V-4.

In some embodiments, one or more of the three metal lines ML-1 through ML-3 may comprise the same metal (e.g., ruthenium or molybdenum) as the third and fourth vias V-3, V-4. Moreover, the metal of the three metal lines ML-1 through ML-3 may be different from that of the first and second vias V-1, V-2 and different from that of the conductive material 227.

For example, the third metal line ML-3 may overlap and contact the third and fourth metal vias V-3, V-4, in the direction Z, and may comprise the same metal as the third and fourth metal vias V-3, V-4. Accordingly, visible boundaries between the third metal line ML-3 and the third and fourth metal vias V-3, V-4 may not be present. For simplicity of illustration, however, boundaries between the third metal line ML-3 and the third and fourth metal vias V-3, V-4 are shown in FIG. 2A with dotted lines.

Moreover, the third and fourth metal vias V-3, V-4 may overlap and contact the second metal line ML-2 and another metal line, respectively, in the direction Z, and may comprise the same metal as the second metal line ML-2 and the other metal line. For simplicity of illustration, boundaries between the third and fourth metal vias V-3, V-4 and the second metal line ML-2 and the other metal line, respectively, are shown in FIG. 2A with dotted lines.

The first metal line ML-1 may be electrically isolated from the third metal line ML-3 and the third and fourth metal vias V-3, V-4 (and from the first metal via V-1). In the cross-sectional view shown in FIG. 2A, a center point, in the direction X, of the first metal line ML-1 may not overlap, in the direction Z, any metal via V that is in the first insulating layer 220. The first metal line ML-1, however, may extend longitudinally in a horizontal direction Y, and may be electrically connected to one or more metal vias V and/or metal lines ML that are not shown in the cross-sectional view of FIG. 2A/2B. According to some embodiments, the five metal lines ML that are shown in the third insulating layer 230 may each extend longer in the direction Y than each of the four metal vias V-1 through V-4.

As shown in FIG. 2B, the third and fourth metal vias V-3, V-4 may be in the third insulating layer 230. Accordingly, the fourth insulating layer 240 (FIG. 2A) may be omitted. In some embodiments, the third and fourth metal vias V-3, V-4 may be thinner, in the direction Z, when the fourth insulating layer 240 is omitted. Moreover, sidewalls of the third and fourth metal vias V-3, V-4 may be aligned, in the direction Z, with sidewalls of the second metal line ML-2 and another metal line, respectively, even when the second metal line ML-2 and the other metal line are shifted, in the direction X, relative to the first and second metal vias V-1, V-2, respectively. The example cross-section of the BEOL region 130 shown in FIG. 2B may otherwise be the same as the example cross-section shown in FIG. 2A.

Figure 5A:
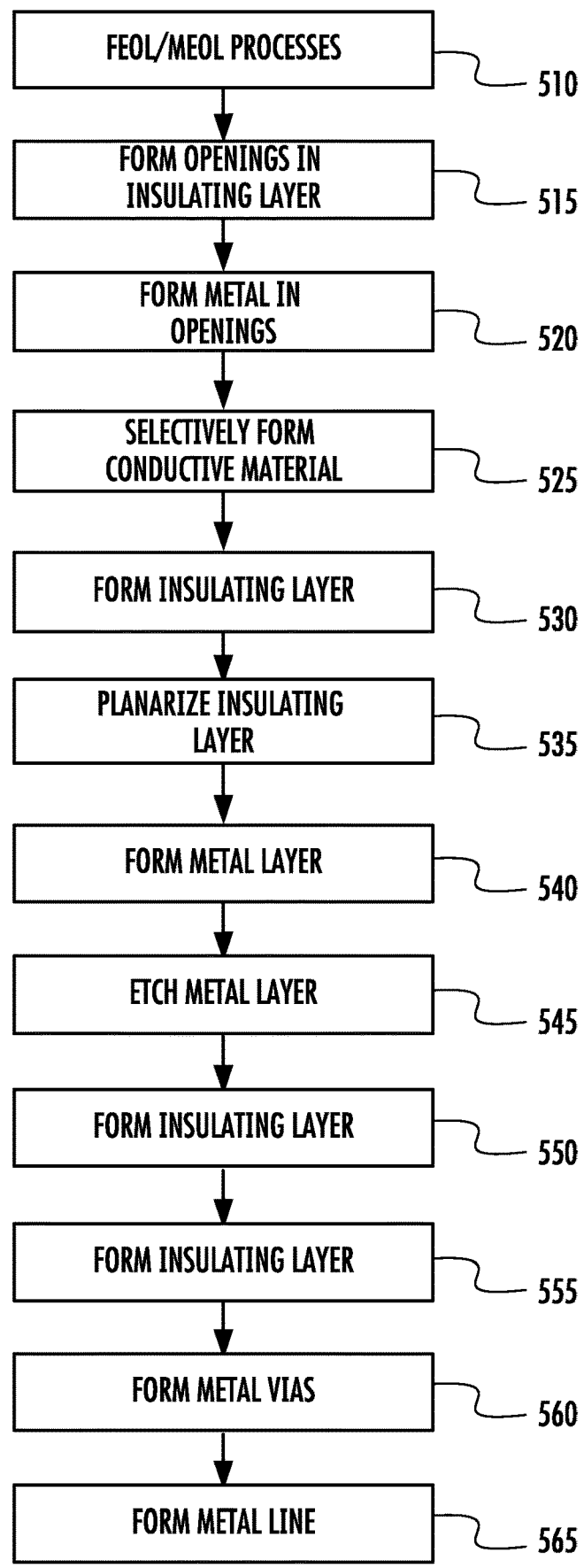
FIG. 5A is a flowchart corresponding to the operations shown in FIGS. 3A-3J.

FIGS. 3A-3J are cross-sectional views illustrating operations of forming an integrated circuit device 100 (FIG. 1) according to some embodiments herein. For example, FIGS. 3A-3J may comprise a damascene process. FIG. 5A is a flowchart corresponding to the operations shown in FIGS. 3A-3J.

Figure 3A:
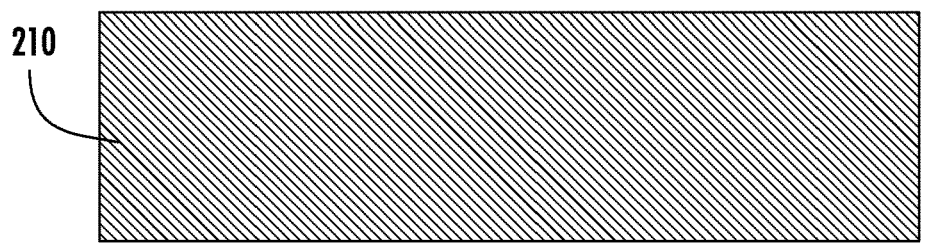
FIGS. 3A-3J are cross-sectional views illustrating operations of forming an integrated circuit device according to some embodiments herein.

As shown in FIGS. 3A and 5A, the metal base 210 may be formed after performing (Block 510) FEOL/MEOL processes on the substrate 110 (FIG. 1). For example, all elements of the FEOL/MEOL region 120 (FIG. 1) of the device 100 may be formed before forming the metal base 210. All operations shown in FIG. 5A after Block 510 may be BEOL operations/processes.

Figure 3B:
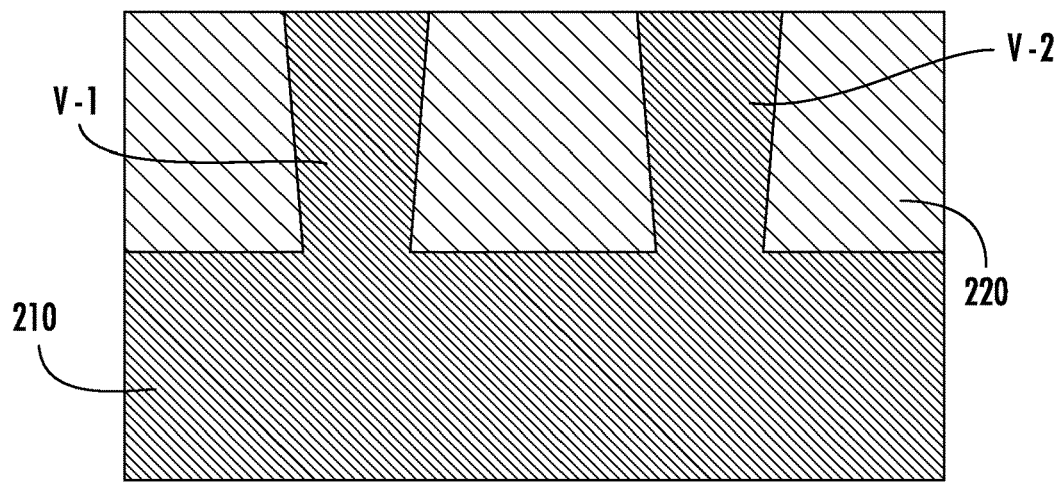

As shown in FIGS. 3B and 5A, the BEOL operations may include forming the first insulating layer 220 on the metal base 210, forming (Block 515) openings in the first insulating layer 220, and forming (Block 520) metal in the openings. For example, the cross-sectional view that is shown in FIG. 3B includes two openings in the first insulating layer 220 that may be filled with the first and second metal vias V-1, V-2, respectively. The metal vias V-1, V-2 may be metal protrusions, respectively, that are spaced apart from each other in the direction X (FIG. 2A) and protrude upward from the metal base 210 in the direction Z (FIG. 2A). The metal of the metal vias V-1, V-2 and the metal base 210 may comprise, for example, tungsten or copper. Moreover, the first insulating layer 220 is on sidewalls of the metal vias V-1, V-2.

Figure 3C:
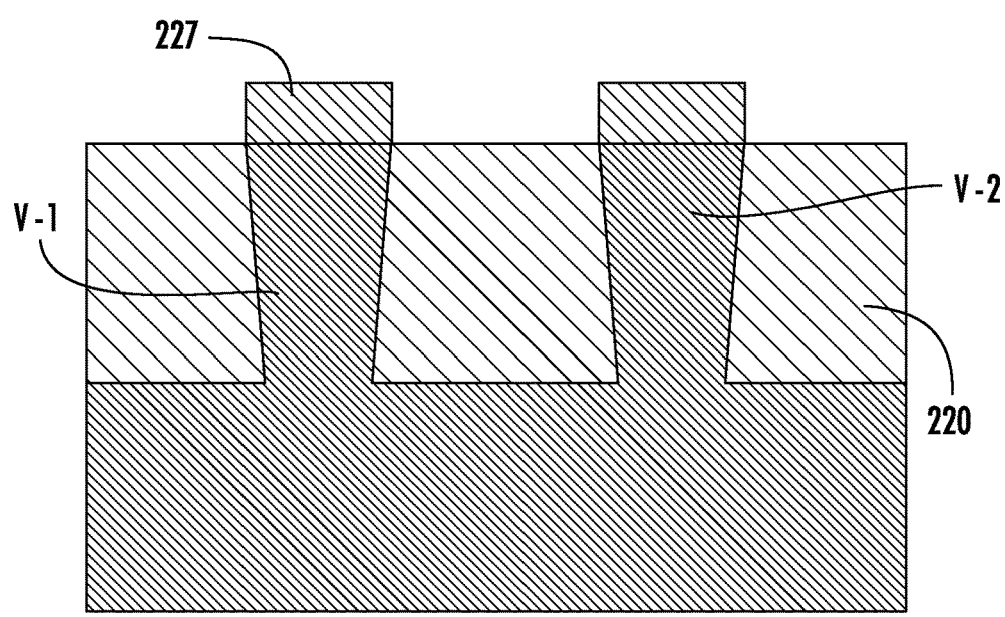

As shown in FIGS. 3C and 5A, the BEOL operations may include selectively forming (Block 525) a conductive material 227 on upper surfaces of the first and second metal vias V-1, V-2, respectively, and not on an upper surface of the first insulating layer 220 that the metal vias V-1, V-2 are in. As an example, the conductive material 227 may be formed by using a precursor or reactant that selectively reacts with the metal vias V-1, V-2. Formation of the conductive material 227 thus may be completed without requiring either etching or alignment with the metal vias V-1, V-2. In some embodiments, the conductive material 227 may be formed by performing selective deposition on the upper surfaces (e.g., exposed upper surfaces) of the metal vias V-1, V-2.

The conductive material 227 may comprise a metal different from that of the metal vias V-1, V-2. For example, the conductive material 227 may comprise cobalt, tungsten, titanium, and/or tantalum, and the metal vias V-1, V-2 may comprise tungsten or copper.

Figure 3D:
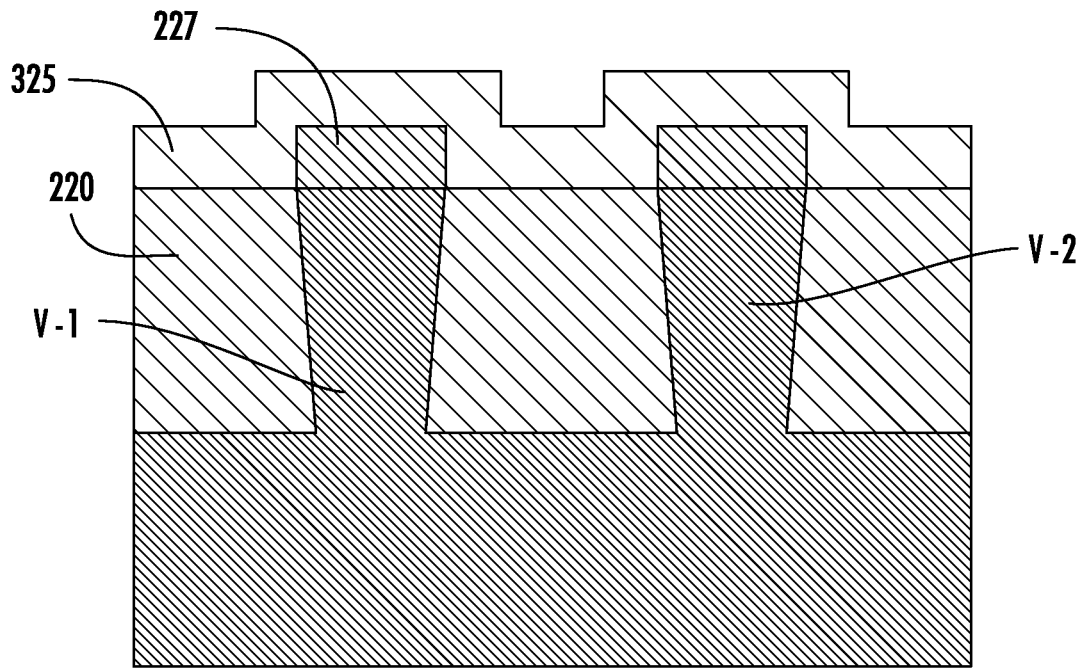
Figure 3E:
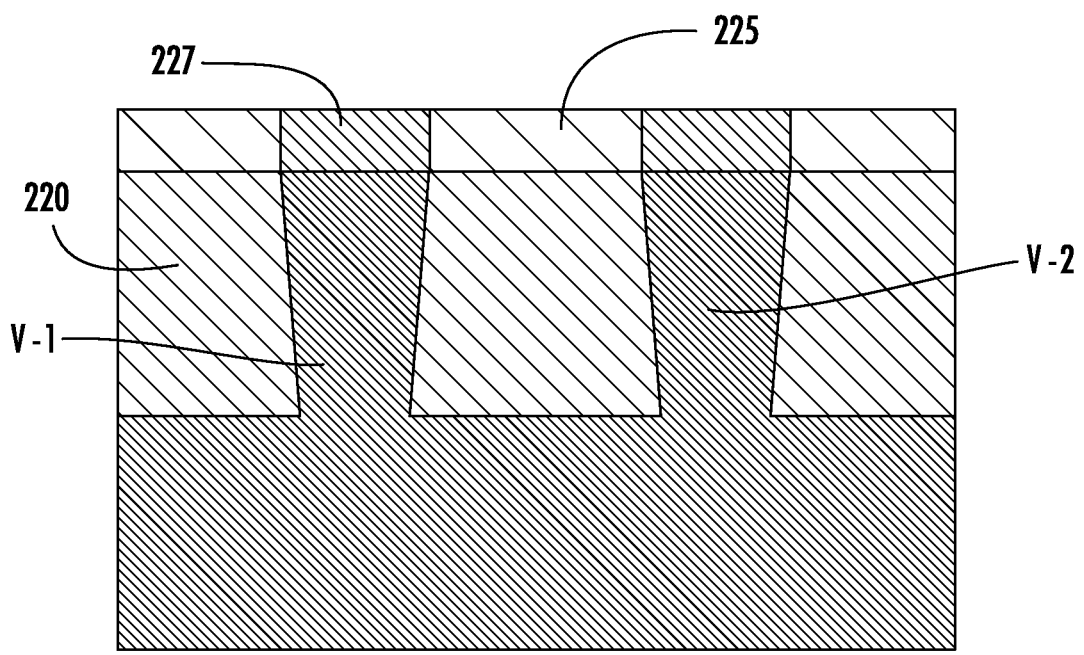

The second insulating layer 225 may be formed on the first insulating layer 220 such that the conductive material 227 is in (e.g., between sidewalls of) the second insulating layer 225. For example, as shown in FIGS. 3D and 5A, the BEOL operations may include conformally forming (Block 530) an insulating layer 325 on the conductive material 227 and on the upper surface of the first insulating layer 220. Moreover, as shown in FIGS. 3E and 5A, the BEOL operations may include etching/planarizing (Block 535) (e.g., by chemical-mechanical planarization ("CMP")) the insulating layer 325, thereby forming the second insulating layer 225. The second insulating layer 225 may thus be the portions of the insulating layer 325 that remain after the etching/planarizing.

The upper surface of the second insulating layer 225 may be coplanar with the upper surfaces of first and second instances of the conductive material 227 on the first and second metal vias V-1, V-2, respectively, and/or the lower surface of the second insulating layer 225 may be coplanar with the lower surfaces of first and second instances of the conductive material 227 on the metal vias V-1, V-2, respectively. As an example, the second insulating layer 225 may have the same thickness, in the direction Z (FIG. 2A), as the conductive material 227. Moreover, a portion of the second insulating layer 225 may be between, in the direction X (FIG. 2A), the conductive material 227 that is on the first metal via V-1 and the conductive material 227 that is on the second metal via V-2.

Figure 3F:
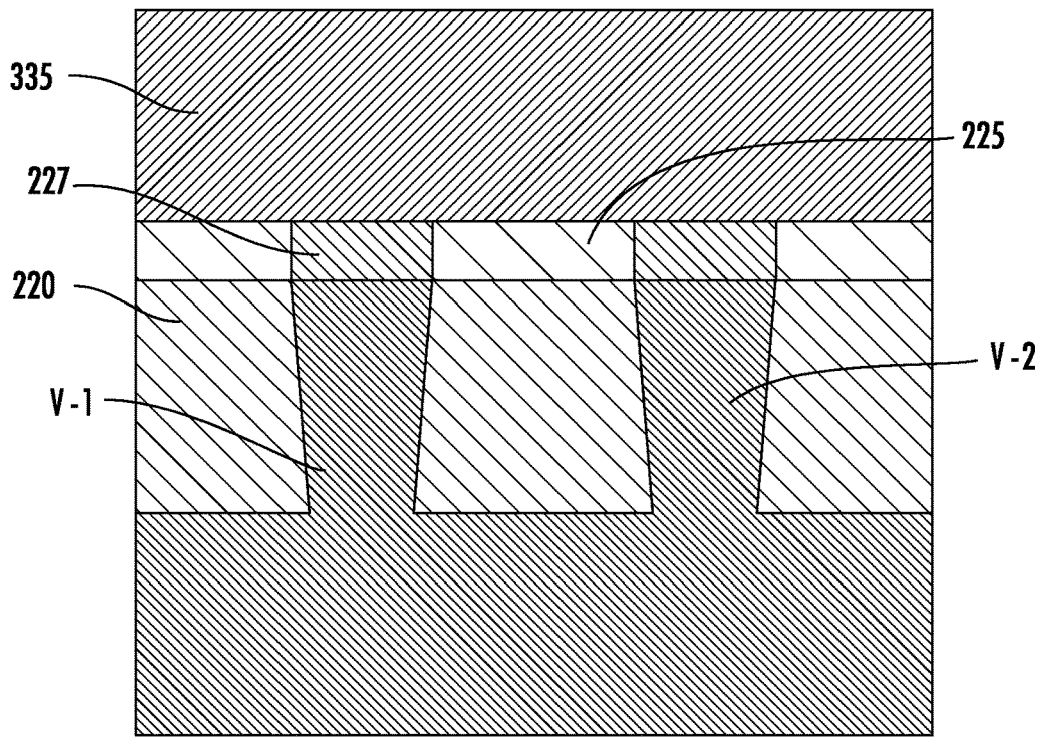

As shown in FIGS. 3F and 5A, the BEOL operations may include forming (Block 540) a metal layer 335 on (e.g., in contact with) the second insulating layer 225 and the conductive material 227. For example, the metal layer 335 may be formed by a metal deposition process. The metal layer 335 may comprise a different metal (e.g., ruthenium or molybdenum) from that of the conductive material 227 (e.g., cobalt, tungsten, titanium, and/or tantalum).

Figure 3G:
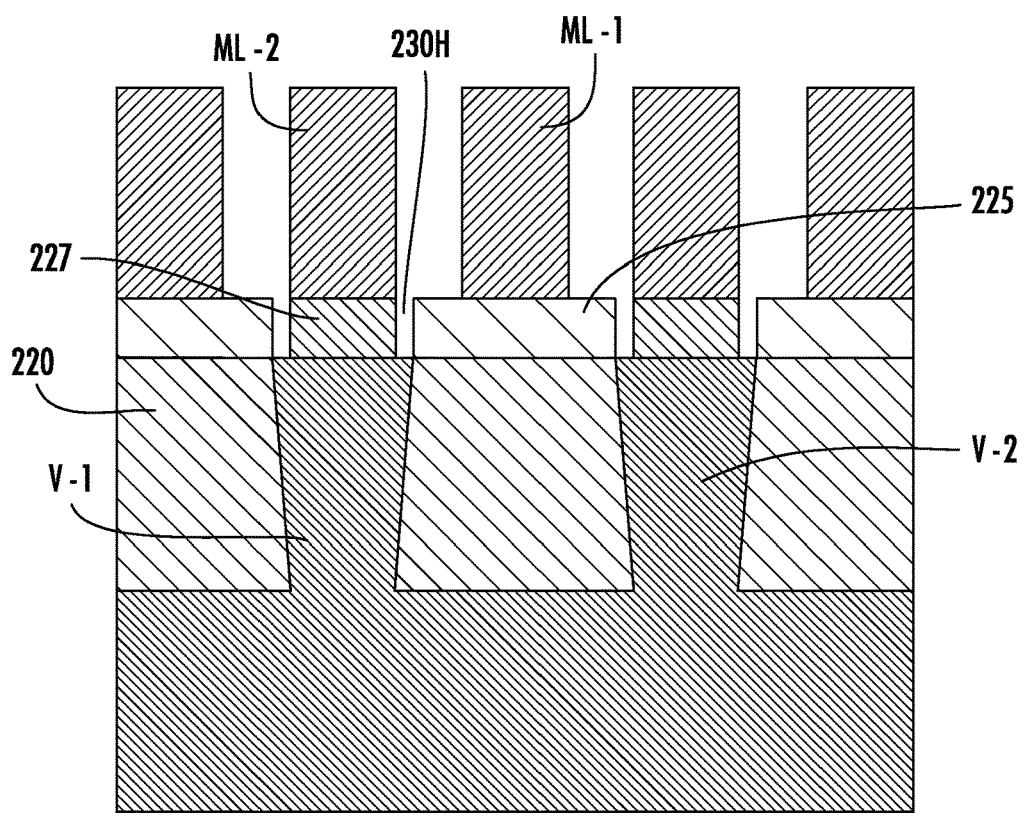

As shown in FIGS. 3G and 5A, the BEOL operations may include patterning/etching (Block 545) the metal layer 335 to form the first and second metal lines ML-1, ML-2. During the patterning/etching, an etch mask may cover portions of the metal layer 335 that will be implemented as the metal lines ML-1, ML-2. Portions of the upper surface of the second insulating layer 225 may be exposed by the patterning/etching.

Moreover, sidewalls/edge portions of the conductive material 227 may be etched/recessed to form openings 230H between, in the direction X (FIG. 2A/2B), the conductive material 227 and the second insulating layer 225. As an example, the conductive material 227 that is between the second metal line ML-2 and the first metal via V-1 may have the same width, in the direction X, as the second metal line ML-2, after forming the openings 230H. In contrast, the portion of the second insulating layer 225 that is between the first metal line ML-1 and the first insulating layer 220 may be wider, in the direction X, than the first metal line ML-1, as the second insulating layer 225 may have an etch selectivity with respect to the first and second metal lines ML-1, ML-2 (and with respect to the conductive material 227).

The openings 230H may expose portions of upper surfaces of the first and second metal vias V-1, V-2, respectively. If the second metal line ML-2 (e.g., a vertical center axis thereof) is aligned with the first metal via V-1 (e.g., a vertical center axis thereof), then the upper surface of the first metal via V-1 may be exposed by two openings 230H, as shown in FIG. 3G. On the other hand, if the second metal line ML-2 (e.g., the vertical center axis thereof) is shifted (i.e., misaligned) relative to the first metal via V-1 (e.g., the vertical center axis thereof), then the upper surface of the first metal via V-1 may be exposed by a single opening 230H, which may result in the cross-section that is shown in FIG. 2A.

Figure 3H:
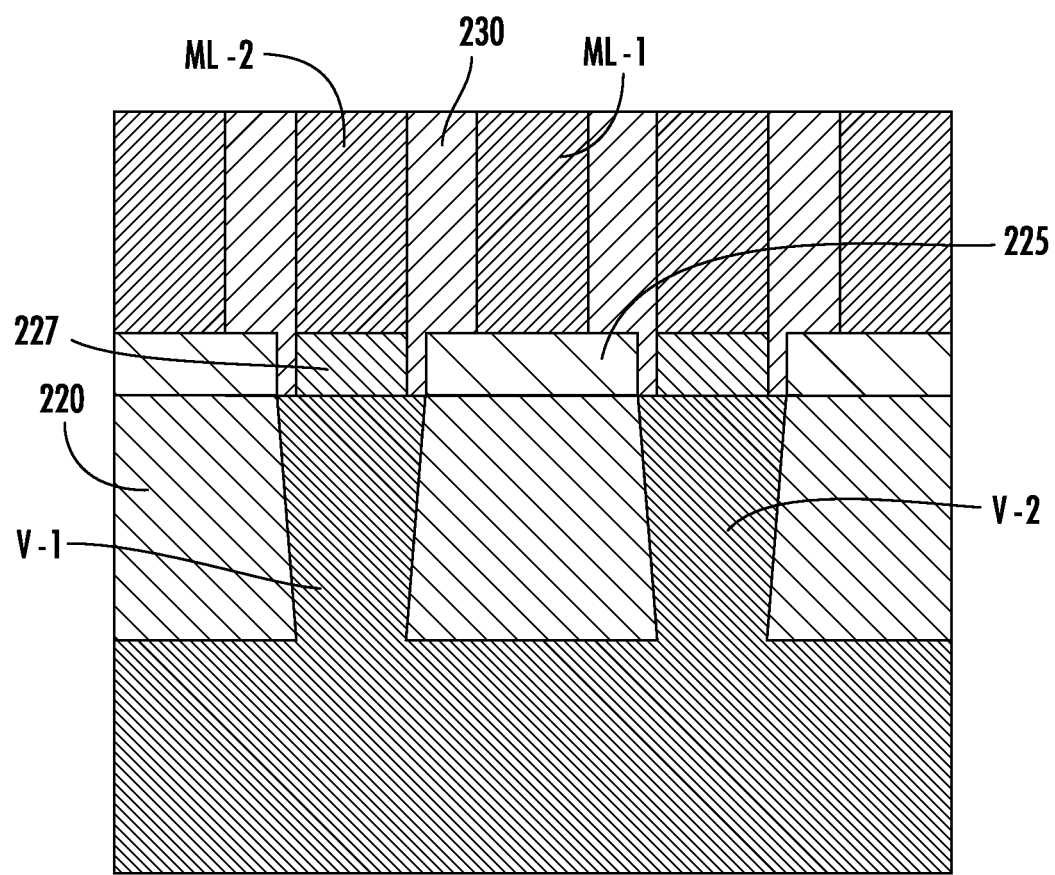

As shown in FIGS. 3H and 5A, the BEOL operations may include forming (Block 550) the third insulating layer 230 in the openings 230H (FIG. 3G) and on sidewalls of the first and second metal lines ML-1, ML-2. As an example, the third insulating layer 230 may contact sidewalls and the upper surface of the second insulating layer 225. Moreover, the third insulating layer 230 may include a different insulating material (e.g., a material that does not include nitrogen) than the second insulating layer 225. According to some embodiments, a CMP process may be performed so that the upper surface of the third insulating layer 230 is coplanar with the upper surfaces of the first and second metal lines ML-1, ML-2, respectively.

Figure 3I:
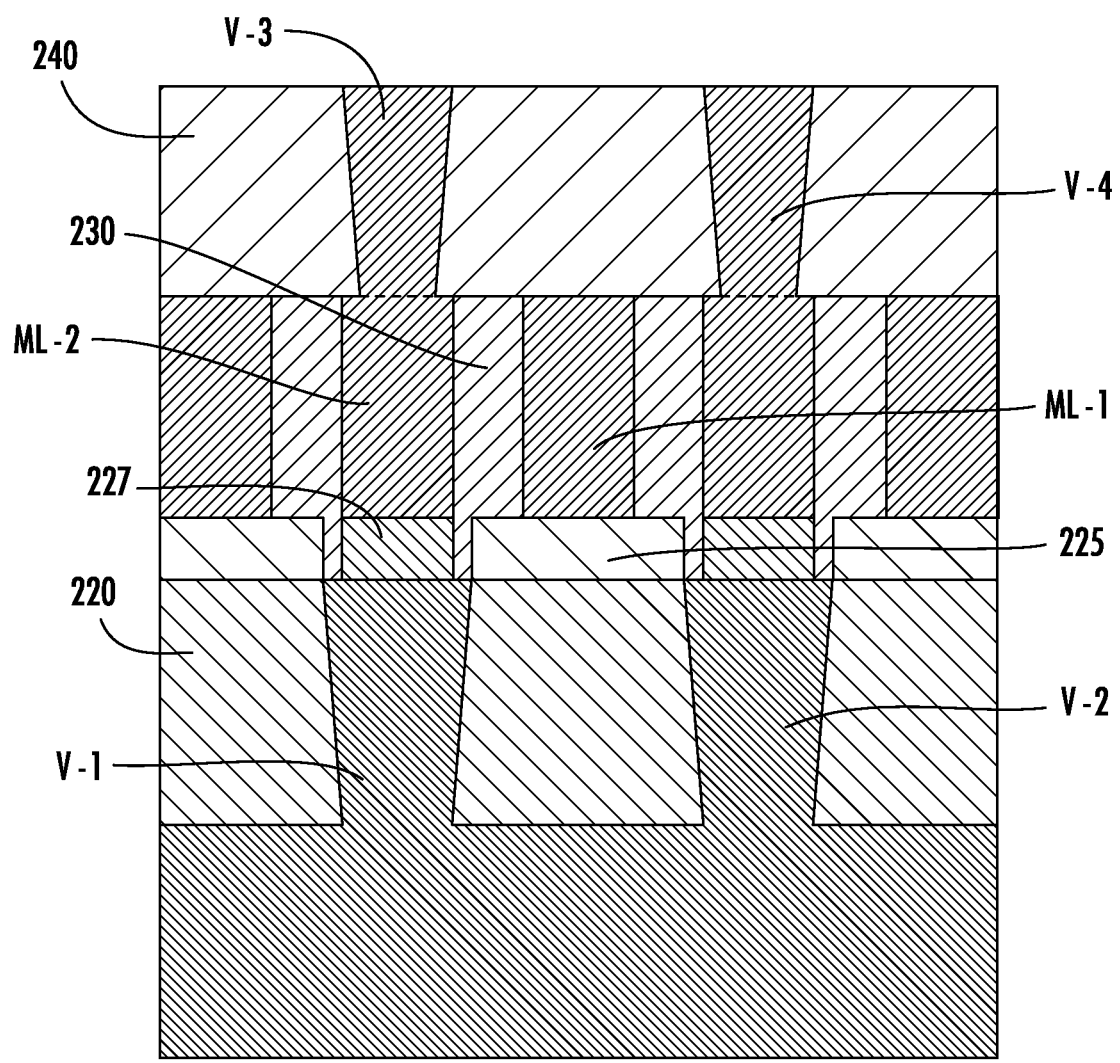
Figure 3J:
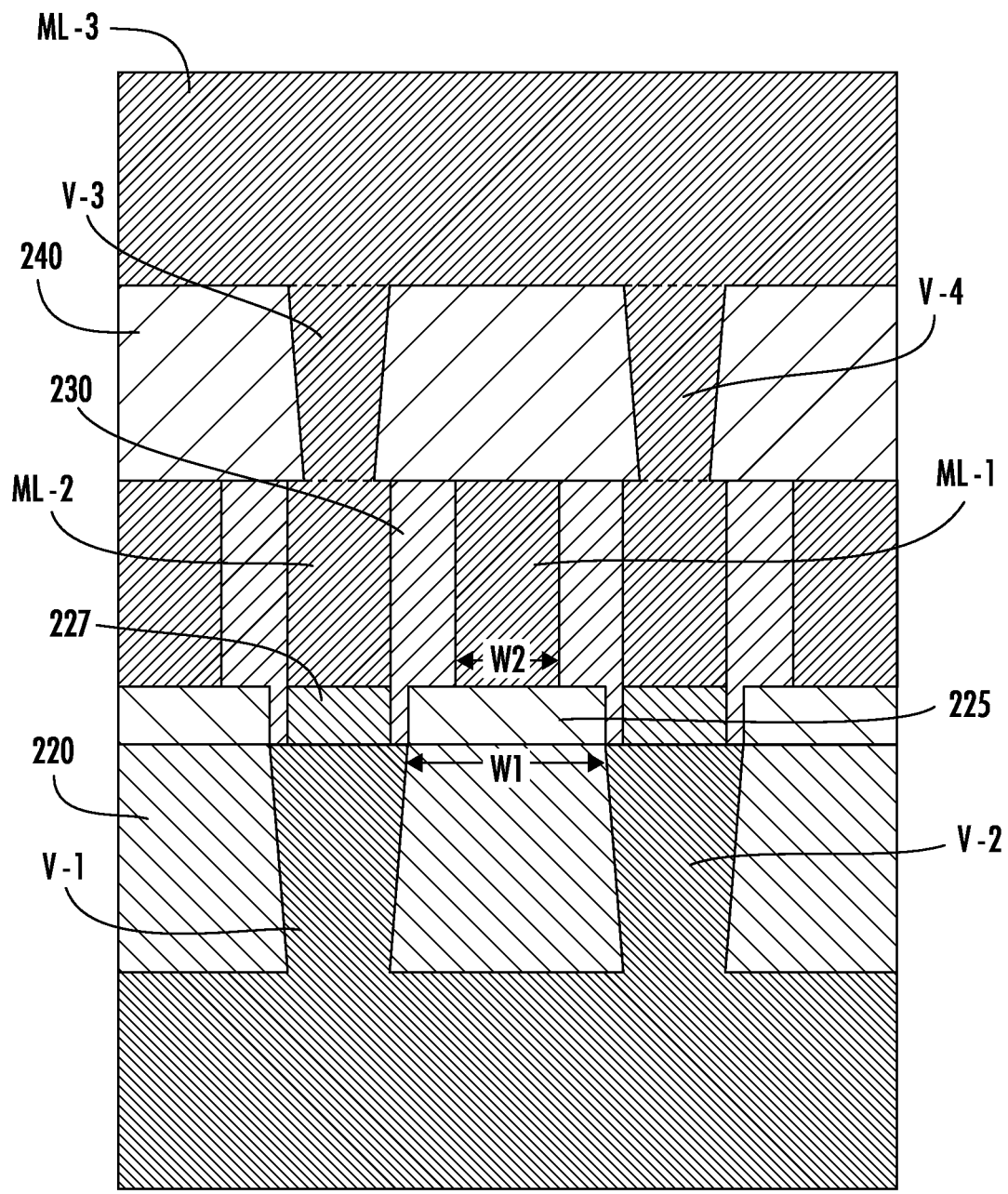

As shown in FIGS. 3I and 5A, the BEOL operations may include forming (Block 555) the fourth insulating layer 240 on (e.g., in contact with) the upper surface of the third insulating layer 230 and the upper surfaces of the first and second metal lines ML-1, ML-2. In some embodiments, the fourth insulating layer 240 may include the same insulating material as the third insulating layer 230. In other embodiments, the fourth insulating layer 240 may include a different insulating material from the third insulating layer 230.

As further shown in FIGS. 3I and 5A, the BEOL operations may also include forming openings in the fourth insulating layer 240 and forming (Block 560) the third and fourth metal vias V-3, V-4 in two of the openings, respectively. For example, FIG. 3I shows that the third and fourth metal vias V-3, V-4 may be formed on (e.g., in contact with)

the upper surfaces, respectively, of the second metal line ML-2 and another metal line that is between (and electrically connected to) the second and fourth metal vias V-2, V-4. Moreover, the third and fourth metal vias V-3, V-4 may comprise the same metal as the second metal line ML-2 and the other metal line. For simplicity of illustration, boundaries between the third and fourth metal vias V-3, V-4 and the second metal line ML-2 and the other metal line, respectively, are shown in FIG. 3I with dotted lines.

As shown in FIGS. 3J and 5A, the BEOL operations may include forming (Block 565) the third metal line ML-3 on (e.g., in contact with) the upper surface of the fourth insulating layer 240 and the upper surfaces of the third and fourth metal vias V-3, V-4, respectively. For example, the third metal line ML-3 may extend continuously, in the direction X (FIG. 2A), across the third and fourth metal vias V-3, V-4 (including continuously across a portion of the fourth insulating layer 240 that is between the third and fourth metal vias V-3, V-4).

In some embodiments, the third metal line ML-3 may comprise the same metal as the third and fourth metal vias V-3, V-4. For simplicity of illustration, boundaries between the third and fourth metal vias V-3, V-4 and the third metal line ML-3 are shown in FIG. 3J with dotted lines.

Moreover, FIG. 2A illustrates an example cross-section in which the second metal line ML-2 is shifted relative to the first metal via V-1 due to misalignment during the etching/patterning operation(s) shown in FIG. 3G. A device 100 having the cross-section shown in FIG. 2A can thus be formed by (i) performing the operations of FIGS. 3A-3F, (ii) misaligning the second metal line ML-2 with the first metal via V-1 while performing the operation(s) of FIG. 3G, and then (iii) performing the operations of FIGS. 3H-3J.

FIGS. 4A-4E are cross-sectional views illustrating operations of forming an integrated circuit device 100 (FIG. 1) according to other embodiments herein. For example, FIGS. 4A-4E may comprise a top-via process. FIG. 5B is a flowchart corresponding to the operations shown in FIGS. 4A-4E. The operations shown in FIG. 5B may be preceded by the operations shown in Blocks 510-535 of FIG. 5A, and thus may be BEOL operations.

Figure 4A:
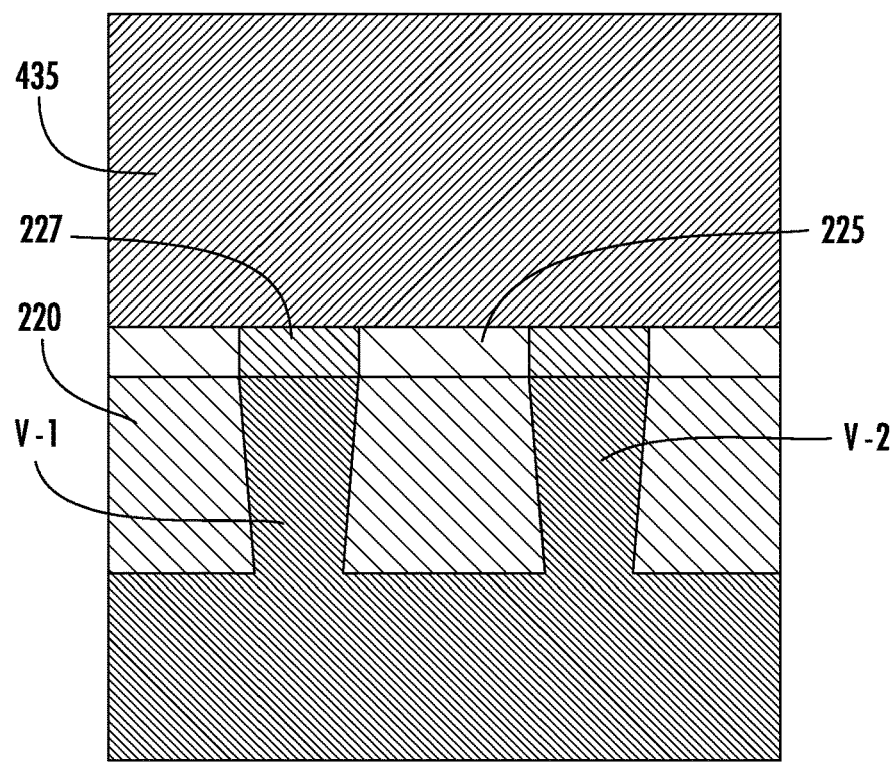
FIGS. 4A-4E are cross-sectional views illustrating operations of forming an integrated circuit device according to other embodiments herein.
Figure 4C:
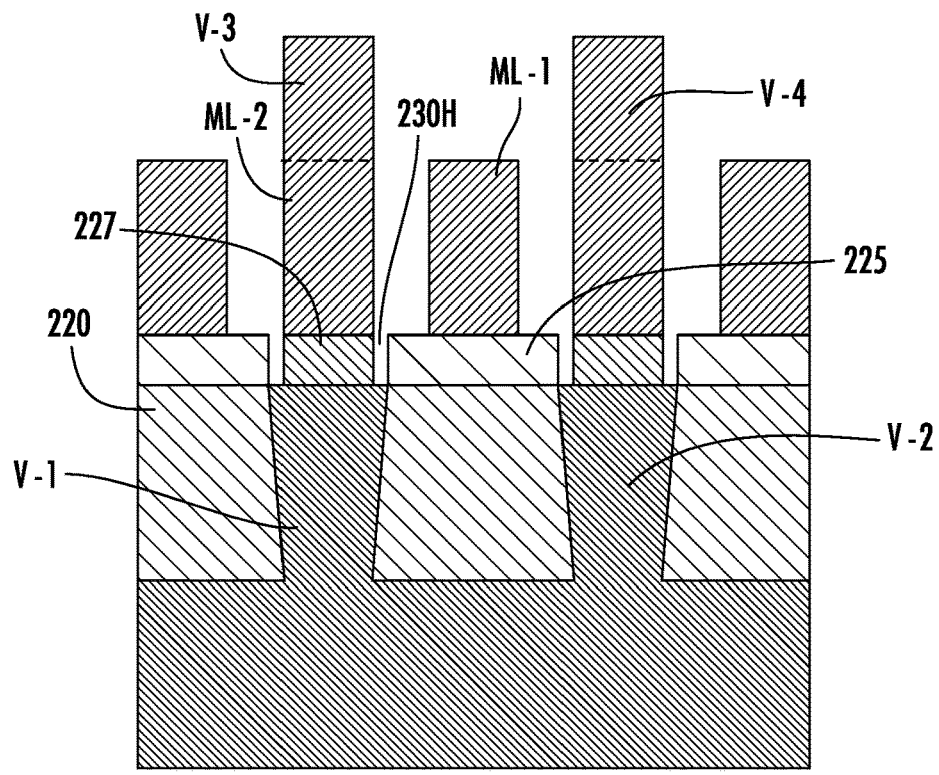
Figure 5B:
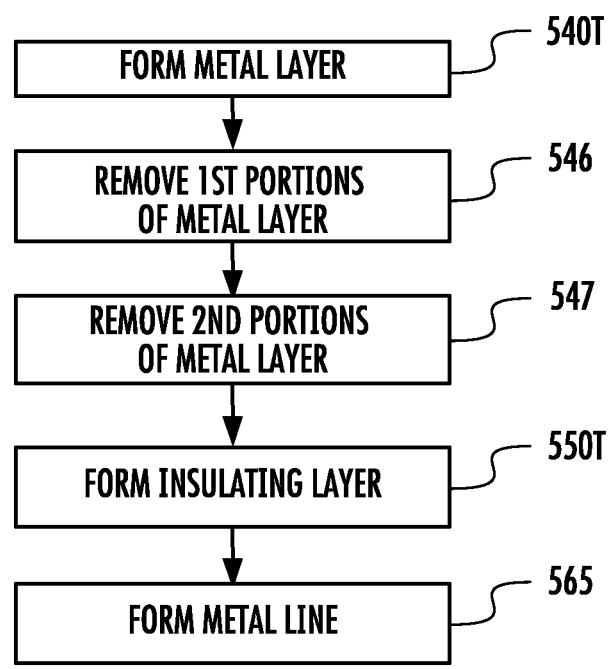
FIG. 5B is a flowchart corresponding to the operations shown in FIGS. 4A-4E.

As shown in FIGS. 4A and 5B, the BEOL operations may include forming (Block 540T) a metal layer 435 on (e.g., in contact with) the second insulating layer 225 and the conductive material 227. For example, the metal layer 435 may be formed by a metal deposition process. The metal layer 435 may comprise a different metal (e.g., ruthenium or molybdenum) from that of the conductive material 227 (e.g., cobalt, tungsten, titanium, and/or tantalum). Moreover, the metal layer 435 may be thicker, in the direction Z (FIG. 2B), than the metal layer 335 that is shown in FIG. 3F. This greater thickness can facilitate patterning/etching of the metal layer 435 to form metal lines ML and metal vias V, where the metal vias V are on top of respective metal lines ML, as shown in FIG. 4C.

Figure 4B:
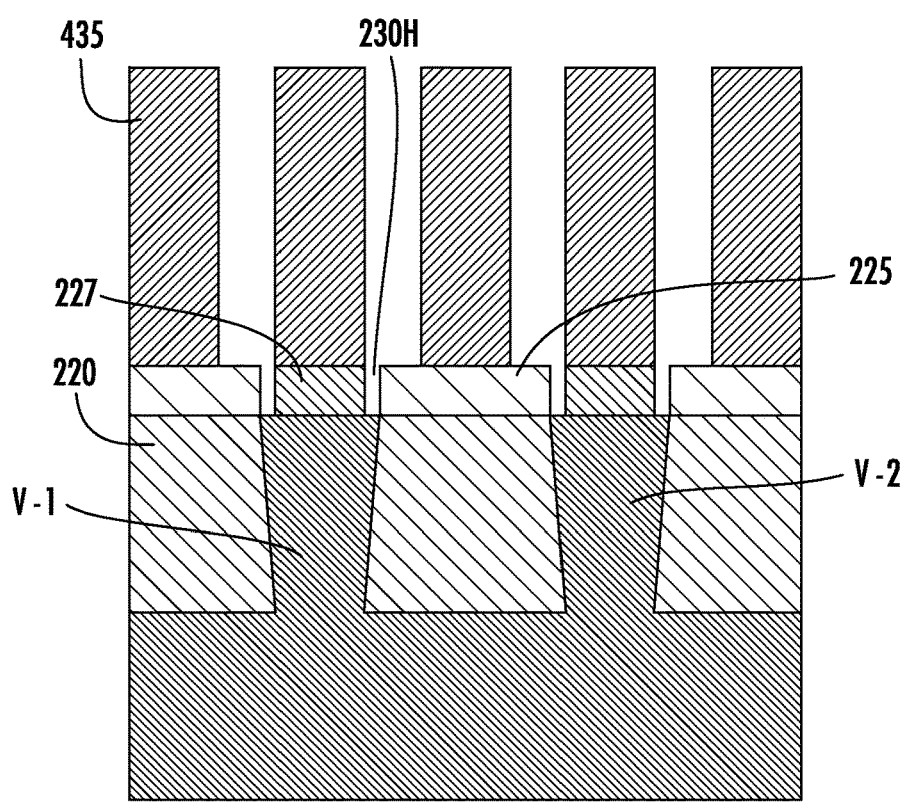

As shown in FIGS. 4B and 5B, the BEOL operations may include removing (Block 546) first portions of the metal layer 435 to expose portions of the upper surface of the second insulating layer 225. For example, the first portions of the metal layer 435 may be etched/patterned while an etch mask covers portions of the metal layer 435 that will be used as metal lines ML or metal vias V (FIG. 4C). Moreover, sidewalls/edge portions of the conductive material 227 may be etched/recessed to form openings 230H between, in the direction X (FIG. 2B), the conductive material 227 and the second insulating layer 225. The openings 230H may expose portions of the upper surfaces of the first and second metal vias V-1, V-2, respectively.

As shown in FIGS. 4C and 5B, the BEOL operations may include etching/removing (Block 547) second portions of the metal layer 435 (FIG. 4B) until respective upper surfaces thereof are coplanar with the dotted lines shown in FIG. 4C, after removing the first portions of the metal layer 435. The second portions of the metal layer 435 may overlap, in the direction Z, the second insulating layer 225. In contrast, third portions of the metal layer 435 that overlap, in the direction Z, the conductive material 227 may not be removed (e.g., may be covered with an etch mask) during removal of the second portions. As a result, the first and second metal lines ML-1, ML-2 may be formed on the second insulating layer 225 and the conductive material 227, respectively, and third and fourth metal vias V-3, V-4 may be formed on the second metal line ML-2 and another metal line that is on the second metal via V-2, respectively.

FIG. 4C thus shows an example in which the second metal line ML-2 and the third metal via V-3 are the lower and upper portions, respectively, of the same patterned/etched portion of the metal layer 435 that is electrically connected to the first metal via V-1 through the conductive material 227. The second metal line ML-2 and the third metal via V-3 that are shown in FIG. 4C thus comprise the same metal (e.g., ruthenium or molybdenum), as they are each patterned/etched from the metal layer 435. Accordingly, a visible boundary between the second metal line ML-2 and the third metal via V-3 may not be present. For simplicity of illustration, however, a boundary between the second metal line ML-2 and the third metal via V-3 is shown in FIG. 4C with a dotted line. Likewise, a boundary between another metal line and the fourth metal via V-4 is shown in FIG. 4C with a dotted line.

Figure 4D:
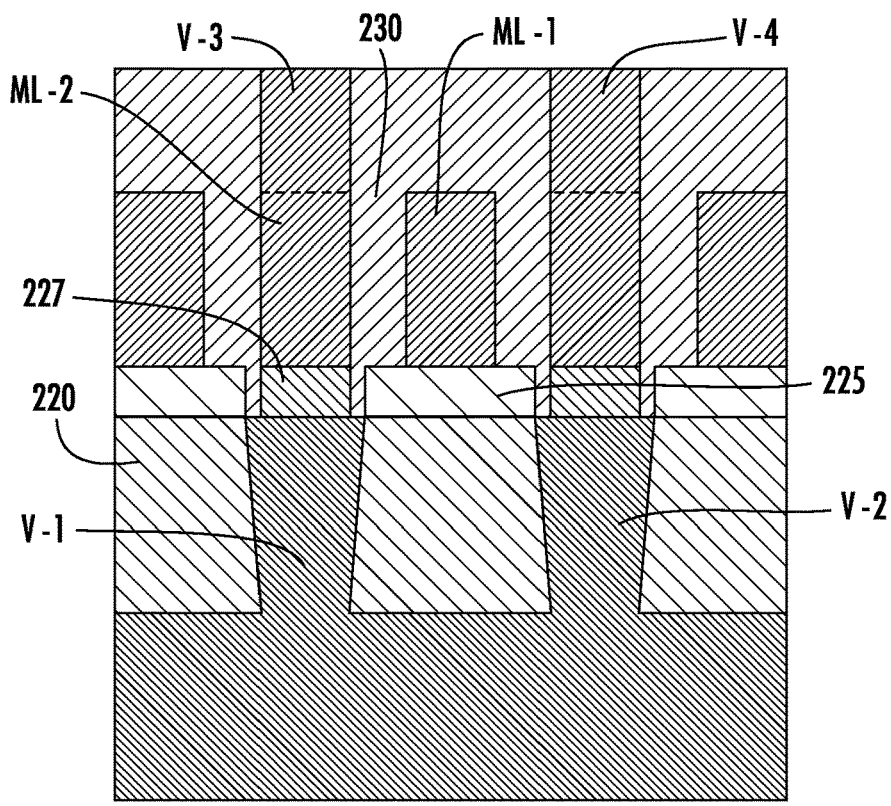

As shown in FIGS. 4D and 5B, the BEOL operations may include forming (Block 550T) the third insulating layer 230 in the openings 230H, on sidewalls and an upper surface of the first metal line ML-1, on sidewalls of the second metal line ML-2, and on sidewalls of the third and fourth metal vias V-3, V-4. In some embodiments, the upper surface of the third insulating layer 230 may be coplanar with the upper surfaces of the third and fourth metal vias V-3, V-4, after performing a CMP process on the third insulating layer 230. Moreover, the third insulating layer 230 may include a different insulating material from that of the second insulating layer 225. As an example, the second insulating material 225 may include nitrogen, and the third insulating layer 230 may not include nitrogen.

Figure 4E:
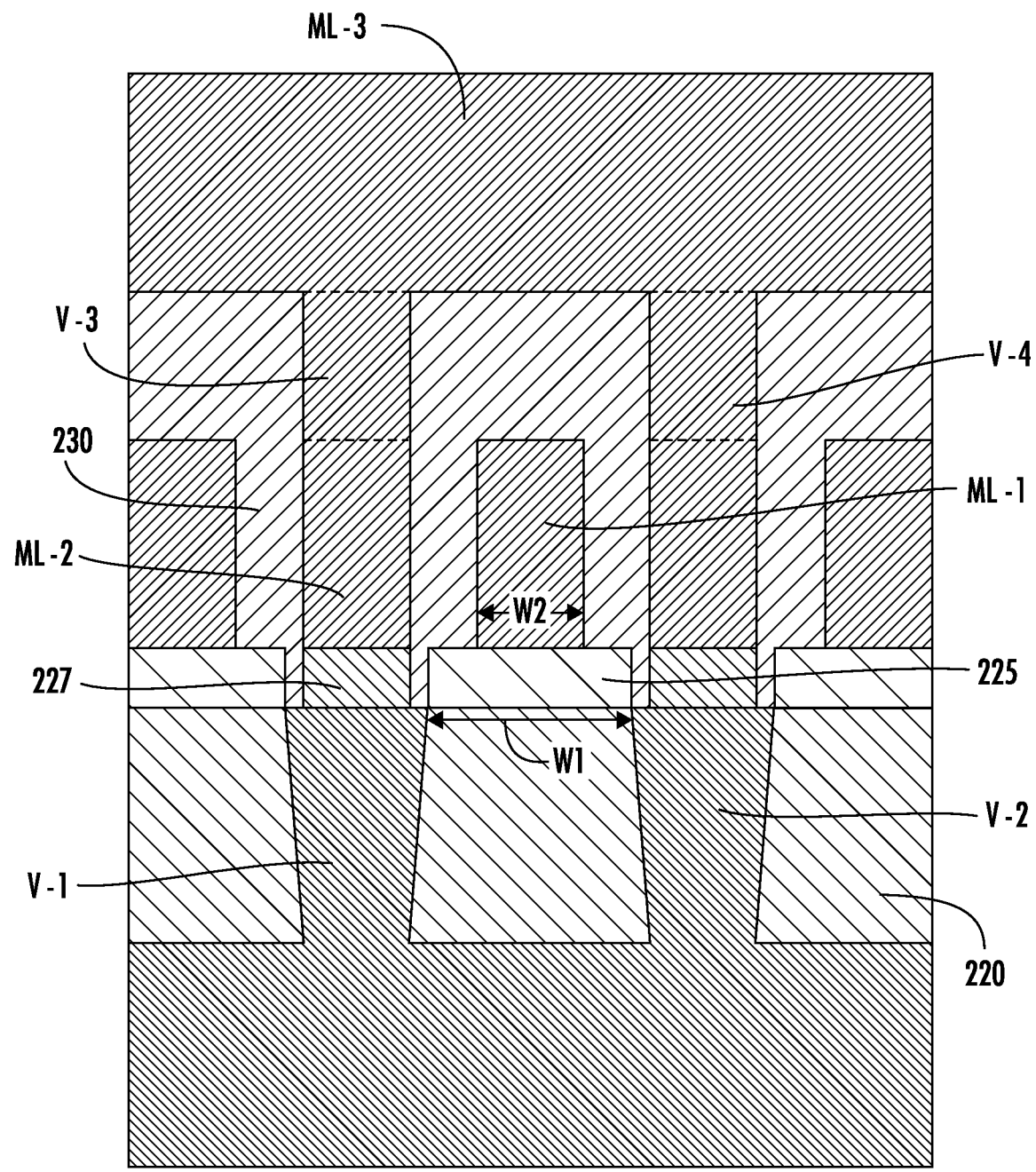

As shown in FIGS. 4E and 5B, the BEOL operations may include forming (Block 565) the third metal line ML-3 on (e.g., in contact with) the upper surface of the third insulating layer 230 and the upper surfaces of the third and fourth metal vias V-3, V-4, respectively. The third metal line ML-3 extends continuously, in the direction X (FIG. 2B), across the third and fourth metal vias V-3, V-4.

According to some embodiments, the third metal line ML-3 may comprise the same metal as the third and fourth metal vias V-3, V-4. Accordingly, visible boundaries between the third metal line ML-3 and the third and fourth metal vias V-3, V-4 may not be present. For simplicity of illustration, however, boundaries between the third metal line ML-3 and the third and fourth metal vias V-3, V-4 are shown in FIG. 4E with dotted lines.

Moreover, FIG. 2B illustrates an example cross-section in which the second metal line ML-2 is shifted relative to the first metal via V-1 due to misalignment during the etching/ patterning operation(s) shown in FIG. 4B. A device 100 having the cross-section shown in FIG. 2B can thus be formed by (i) performing the operations of FIGS. 3A-3E and 4A, (ii) misaligning the second metal line ML-2 with the first metal via V-1 while performing the operations of FIGS. 4B and 4C, and then (iii) performing the operations of FIGS. 4D and 4E.

Figure 6A:
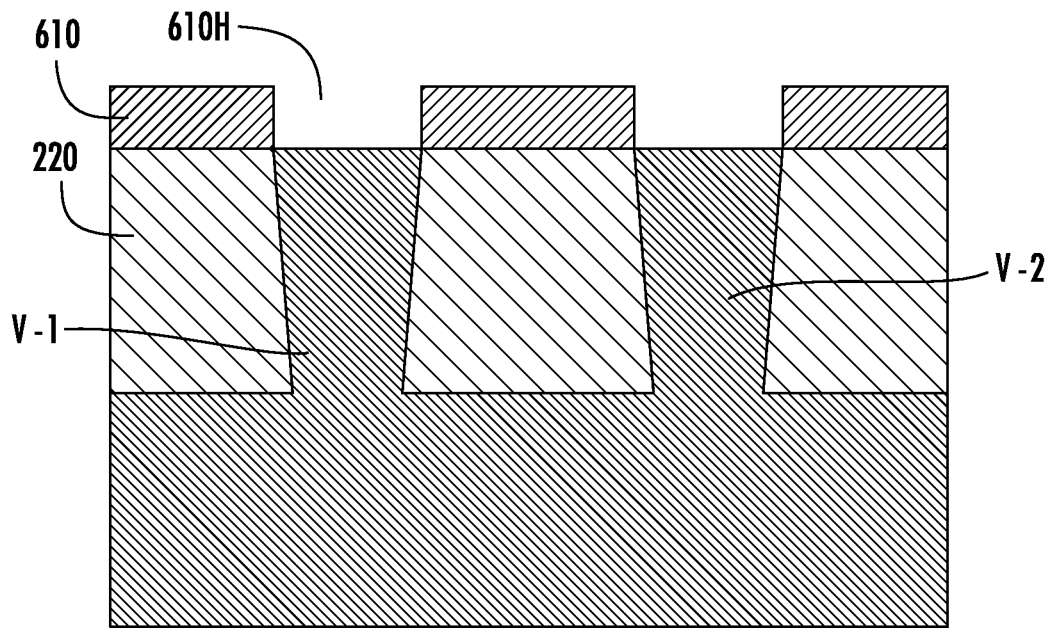
FIGS. 6A and 6B are cross-sectional views illustrating operations of forming an integrated circuit device according to further embodiments herein.
Figure 6B:
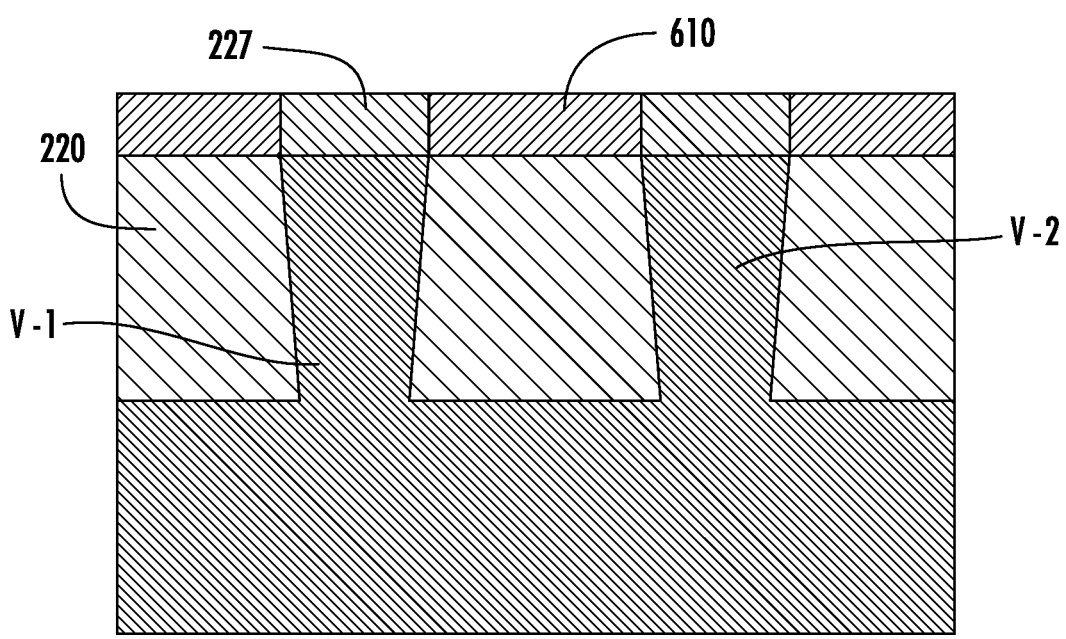

FIGS. 6A and 6B are cross-sectional views illustrating operations of forming an integrated circuit device 100 according to further embodiments herein. The operations shown in FIGS. 6A and 6B are preceded by the operations shown in FIGS. 3A and 3B.

As shown in FIG. 6A, a sacrificial layer 610 may be selectively formed on the upper surface of the first insulating layer 220. For example, the sacrificial layer 610 may be formed by performing self-assembled monolayers ("SAM") deposition on the upper surface of the first insulating layer 220. In some embodiments, the sacrificial layer 610 may comprise carbon. Moreover, the upper surfaces of the first and second metal vias V-1, V-2, respectively, may be exposed through openings 610H in the sacrificial layer 610.

As shown in FIG. 6B, the conductive material 227 may be formed (e.g., deposited) in the openings 610H of the sacrificial layer 610. For example, the conductive material 227 may be conformally formed/deposited on upper and side surfaces of the sacrificial layer 610 and then planarized (e.g., by CMP) until the upper surface of the conductive material 227 is coplanar with the upper surface of the sacrificial layer 610. After forming the conductive material 227, the sacrificial layer 610 may be removed, thereby resulting in the cross-sectional view that is shown in FIG. 3C. Subsequently, the operations shown in FIGS. 3D-3J or FIGS. 3D, 3E, and 4A-4E may be performed.

Integrated circuit devices 100 (FIG. 1) according to embodiments herein may provide a number of advantages. These advantages include reduced susceptibility to misalignment of metal vias V (FIG. 2A) and metal lines ML (FIG. 2A). For example, FIG. 2A shows that providing a second insulating layer 225 between a first insulating layer 220 and a first metal line ML-1 can increase a distance D between the first metal line ML-1 and a diagonally-adjacent first metal via V-1, and thus may be beneficial for manufacturing high-density integrated circuit devices. The increased distance D may allow the first metal via V-1 and the first metal line ML-1 to be scaled down without being so close as to allow for shorting, even when misalignment shifts the first metal line ML-1 horizontally toward the first metal via V-1. Moreover, because the increased distance D is due to the presence of the second insulating layer 225 (which may be diagonally-adjacent the first metal via V-1 and under the first metal line ML-1) rather than due to a narrowing of the first metal via V-1, the first metal via V-1 may be relatively wide and thus relatively easy to form.

Further electrical isolation with respect to the first metal line ML-1 can be provided by etching/recessing a sidewall/edge portion of a conductive material 227 (FIG. 2A) that couples a second metal line ML-2 (FIG. 2A) to the first metal via V-1 and forming a third insulating layer 230 (FIG. 3H) in an opening 230H (FIG. 3G) where the sidewall/edge portion of the conductive material 227 was removed. For example, the third insulating layer 230 may be on (e.g., in contact with) and between a sidewall of the conductive material 227 and a sidewall of the second insulating layer 225. As a result, the likelihood of an electrical short between the conductive material 227 and the first metal line ML-1 can be reduced, even when the first metal line ML-1 is misaligned. Also, the conductive material 227 may be selectively formed (e.g., selectively deposited) on the upper surface of the first metal via V-1, and thus may not require alignment or etching.

Moreover, the first metal line ML-1 may be on a continuous portion of the second insulating layer 225 that is wider, in the direction X (FIG. 2A), than the first metal line ML-1, due to etch selectivity between an insulating material of the second insulating layer 225 and a metal of the first metal line ML-1. Accordingly, etching/patterning the metal layer 335 (FIG. 3F) or the metal layer 435 (FIG. 4A) to form the first and second metal lines ML-1, ML-2 may not substantially remove the second insulating layer 225.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
    a first insulating layer;
    a metal via that is in the first insulating layer;
    a second insulating layer on the first insulating layer;
    a conductive material that is between sidewalls of the second insulating layer and on the metal via;
    a third insulating layer on the second insulating layer; and
    a metal line that is in the third insulating layer, on the conductive material, and electrically connected to the metal via through the conductive material,
    wherein a portion of the third insulating layer contacts a portion of an upper surface of the metal via, and
    wherein the metal via, the conductive material, and the metal line comprise different first, second, and third conductive materials, respectively.

2. The integrated circuit device of claim 1, wherein the second insulating layer is thinner than the first insulating layer and thinner than the third insulating layer.

3. The integrated circuit device of claim 2, wherein a lower surface of the second insulating layer is coplanar with a lower surface of the conductive material.

4. The integrated circuit device of claim 2, wherein an upper surface of the second insulating layer is coplanar with an upper surface of the conductive material.

5. The integrated circuit device of claim 1, wherein an upper surface of the conductive material contacts a lower surface of the metal line.

6. The integrated circuit device of claim 1,
    wherein the portion of the upper surface of the metal via comprises a first portion, and
    wherein a lower surface of the conductive material contacts a second portion of the upper surface of the metal via.

7. The integrated circuit device of claim 1, wherein the second insulating layer comprises an insulating material different from that of the first insulating layer and different from that of the third insulating layer.

8. The integrated circuit device of claim 7,
    wherein the second insulating layer includes nitrogen, and
    wherein the first and third insulating layers do not include nitrogen.

9. The integrated circuit device of claim 1,
    wherein a lower surface of the second insulating layer contacts an upper surface of the first insulating layer, and
    wherein an upper surface of the second insulating layer contacts a lower surface of the third insulating layer.

10. The integrated circuit device of claim 1,
    wherein the metal line comprises a second metal line,
    wherein the integrated circuit device further comprises a first metal line that is in the third insulating layer and on the second insulating layer,
    wherein the portion of the third insulating layer comprises a second portion that is between a sidewall of the conductive material and one of the sidewalls of the second insulating layer, and
    wherein the third insulating layer further comprises a first portion on an upper surface of the second insulating layer.

11. An integrated circuit device, comprising:
    a conductive material, which extends on a metal via but not on a first insulating layer that the metal via is in;
    a second insulating layer, which extends on the first insulating layer and adjacent the conductive material;
    a first metal line, which extends on the second insulating layer and is electrically isolated from the metal via; and
    a second metal line, which extends on the conductive material and is electrically connected by the conductive material to the metal via.

12. The integrated circuit device of claim 11, wherein the second insulating layer is conformal to the conductive material and the first insulating layer; and wherein the second insulating layer has a planarized upper surface thereon that is coplanar with an upper surface of the conductive material.

13. The integrated circuit device of claim 11, further comprising a third insulating layer, which extends between the first and second metal lines and on a portion of the metal via.

14. The integrated circuit device of claim 11, wherein the second insulating layer is formed on an upper surface of the first insulating layer.

15. A method of forming an integrated circuit device, the method comprising:
   forming a conductive material on a metal via and not on a first insulating layer that the metal via is in;
   forming a second insulating layer on the first insulating layer, after forming the conductive material; and
   forming a first metal line on the second insulating layer and a second metal line on the conductive material,
   wherein the first metal line is electrically isolated from the metal via, and
   wherein the second metal line is electrically connected to the metal via through the conductive material.

16. The method of claim 15, wherein forming the conductive material comprises performing selective deposition on the metal via.

17. The method of claim 15, wherein forming the second insulating layer comprises:
   conformally forming the second insulating layer on the conductive material and the first insulating layer; and
   planarizing the second insulating layer so that an upper surface of the second insulating layer is coplanar with an upper surface of the conductive material.

18. The method of claim 15,
   wherein forming the first and second metal lines comprises:
      forming a metal layer on the conductive material and the second insulating layer; and
      removing portions of the metal layer to form the first and second metal lines, and
   wherein the method further comprises:
      exposing a portion of the metal via by removing a portion of the conductive material; and
      forming a third insulating layer between the first and second metal lines and on the exposed portion of the metal via.

* * * * *